(12) United States Patent
Zhang et al.

(10) Patent No.: US 10,871,684 B1
(45) Date of Patent: Dec. 22, 2020

(54) DISPLAY PANEL AND DISPLAY DEVICE

(71) Applicant: Shanghai Tianma Micro-Electronics Co., Ltd., Shanghai (CN)

(72) Inventors: Mingwei Zhang, Shanghai (CN); Baoling Liu, Shanghai (CN); Xiangjian Kong, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/674,833

(22) Filed: Nov. 5, 2019

(30) Foreign Application Priority Data

Jun. 17, 2019 (CN) .......................... 2019 1 0519671

(51) Int. Cl.
  *G09G 3/36* (2006.01)
  *G02F 1/1343* (2006.01)
  *G02F 1/1368* (2006.01)
  *G02F 1/1335* (2006.01)
  (Continued)

(52) U.S. Cl.
  CPC ...... *G02F 1/134309* (2013.01); *G02F 1/1368* (2013.01); *G02F 1/13439* (2013.01); *G02F 1/13452* (2013.01); *G02F 1/133514* (2013.01); *G02F 1/133553* (2013.01); *G02F 1/136286* (2013.01); *G02F 2001/13629* (2013.01); *G02F 2001/134345* (2013.01);
  (Continued)

(58) Field of Classification Search
  CPC ......... G02F 1/134309; G02F 1/133514; G02F 1/133553; G02F 1/13439; G02F 1/13452; G02F 1/136286; G02F 1/1368; G02F 2001/134345; G02F 2001/134381; G02F 2001/13629; G02F 2201/121; G02F 2201/123
  See application file for complete search history.

(56) References Cited

U.S. PATENT DOCUMENTS

2006/0274233 A1* 12/2006 Takizawa .......... G02F 1/133555
  349/108
2008/0068523 A1* 3/2008 Mitsui ............... G02F 1/133555
  349/37

(Continued)

FOREIGN PATENT DOCUMENTS

CN          1794054 A       6/2006

*Primary Examiner* — Hoan C Nguyen
(74) *Attorney, Agent, or Firm* — Anova Law Group PLLC

(57) ABSTRACT

A display panel and a display device are provided. The display panel includes a display region, a color film substrate, and an array substrate. The display region includes transmissive regions each including color sub-pixels, and reflective regions each including black-and-white sub-pixels. A first common electrode is configured in the color film substrate corresponding to all of the transmissive regions and the reflective regions. A plurality of first pixel electrodes is configured in a portion of the array substrate corresponding to the transmissive regions. A plurality of second pixel electrodes, a reflective layer and a plurality of first thin-film transistors are configured in a portion of the array substrate corresponding to the reflective regions. One first thin-film transistor is electrically connected to one first pixel electrode. A second common electrode is configured in the array substrate corresponding to all of the transmissive regions and the reflective regions.

17 Claims, 11 Drawing Sheets

(51) Int. Cl.
 *G02F 1/1362* (2006.01)
 *G02F 1/1345* (2006.01)
(52) U.S. Cl.
 CPC ............ *G02F 2001/134381* (2013.01); *G02F 2201/121* (2013.01); *G02F 2201/123* (2013.01)

(56) References Cited

U.S. PATENT DOCUMENTS

| | | | | |
|---|---|---|---|---|
| 2011/0157254 A1* | 6/2011 | Yamazaki | ............ | G02F 1/13624 345/690 |
| 2014/0347588 A1* | 11/2014 | Hatsumi | ............ | G02F 1/134363 349/43 |
| 2015/0212377 A1* | 7/2015 | Imaoku | ................ | G02F 1/1368 349/42 |

* cited by examiner

DISPLAY PANEL AND DISPLAY DEVICE

CROSS-REFERENCE TO RELATED APPLICATION

This application claims the priority of Chinese Patent Application No. 201910519671.1, filed on Jun. 17, 2019, the content of which is incorporated herein by reference in its entirety.

TECHNICAL FIELD

The present disclosure generally relates to the field of display technology and, more particularly, relates to a display panel and a display device.

BACKGROUND

With the rapid development of electronic products toward to be light-weight, thin and miniaturized, more liquid crystal display modules have been used in electronic products, especially in mobile terminals, such as video recorders, notebook computers, desktop computers, smart televisions, personal digital processors, etc.

The power consumption requirements for the existing terminal electronic products may be high. Currently, a dual-screen design, that is, a black-and-white display and a color display, has developed to switch between the black-and-white display and the color display according to the low power consumption requirements. For example, the color display with higher power consumption is used in a normal mode, and the black-and-white display with lower power consumption is used in a standby mode. However, the dual-screen design may result in high manufacturing cost, and the overall thickness of the display screen may be large. There is a need to provide a display panel and a display device, which have thin thickness and high reliability, capable of implementing the switch between the black-and-white display and the color display.

SUMMARY

One aspect of the present disclosure provides a display panel. The display panel includes a display region, an array substrate, a color film substrate opposite to the array substrate, and a liquid crystal layer between the array substrate and the color film substrate. The display region includes transmissive regions each including color sub-pixels, and reflective regions each including black-and-white sub-pixels. A first common electrode is configured in the color film substrate corresponding to all of the transmissive regions and the reflective regions. A plurality of first pixel electrodes is configured to be spaced apart from one another and in a portion of the array substrate corresponding to the transmissive regions, and the plurality of the first pixel electrodes correspond to the color sub-pixels. A plurality of second pixel electrodes, a reflective layer and a plurality of first thin-film transistors are configured in a portion of the array substrate corresponding to the reflective regions, and the plurality of the second pixel electrodes correspond to the black-and-white sub-pixels. The reflective layer is at a side of the plurality of the second pixel electrodes adjacent to the liquid crystal layer; the plurality of the thin-film transistors is at a side of the plurality of the second pixel electrodes away from the liquid crystal layer; and one first thin-film transistor is electrically connected to one first pixel electrode. A second common electrode is configured in the array substrate corresponding to all of the transmissive regions and the reflective regions; along a direction perpendicular to the array substrate, the second common electrode is between a first thin-film transistor and a second pixel electrode; and the second common electrode and the first common electrode is configured to receive a same voltage signal.

Another aspect of the present disclosure provides a display device including the above-mentioned display panel. The display panel includes a display region, an array substrate, a color film substrate opposite to the array substrate, and a liquid crystal layer between the array substrate and the color film substrate. The display region includes transmissive regions each including color sub-pixels, and reflective regions each including black-and-white sub-pixels. A first common electrode is configured in the color film substrate corresponding to all of the transmissive regions and the reflective regions. A plurality of first pixel electrodes is configured to be spaced apart from one another and in a portion of the array substrate corresponding to the transmissive regions, and the plurality of the first pixel electrodes correspond to the color sub-pixels. A plurality of second pixel electrodes, a reflective layer and a plurality of first thin-film transistors are configured in a portion of the array substrate corresponding to the reflective regions, and the plurality of the second pixel electrodes correspond to the black-and-white sub-pixels. The reflective layer is at a side of the plurality of the second pixel electrodes adjacent to the liquid crystal layer; the plurality of the thin-film transistors is at a side of the plurality of the second pixel electrodes away from the liquid crystal layer; and one first thin-film transistor is electrically connected to one first pixel electrode. A second common electrode is configured in the array substrate corresponding to all of the transmissive regions and the reflective regions; along a direction perpendicular to the array substrate, the second common electrode is between a first thin-film transistor and a second pixel electrode; and the second common electrode and the first common electrode is configured to receive a same voltage signal.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure. Drawings incorporated in the specification and forming part of the specification demonstrate embodiments of the present disclosure and, together with the specification, describe the principles of the present disclosure.

DETAILED DESCRIPTION

Figure 1:
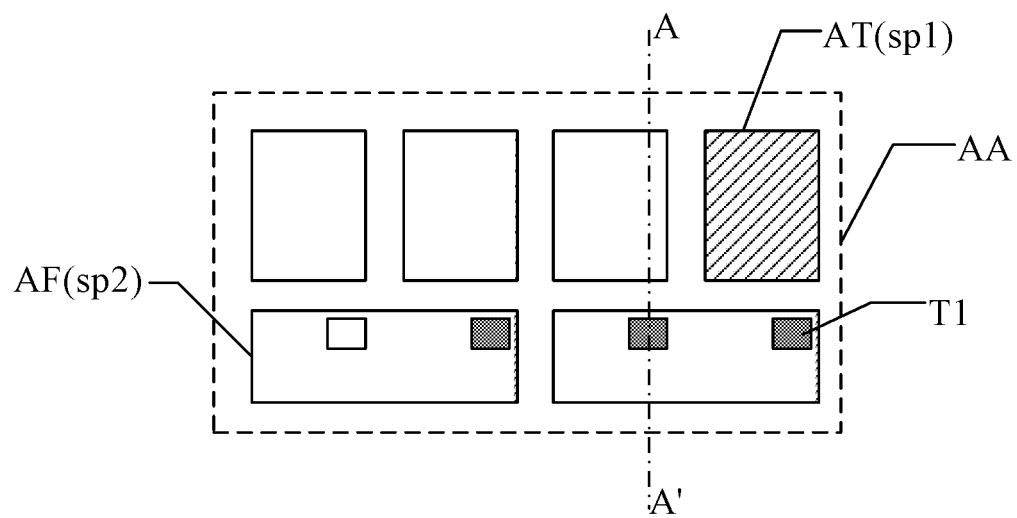
FIG. 1 illustrates a local schematic of a display panel of an optional embodiment according to embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

Various exemplary embodiments of the present disclosure will be described in detail with reference to the drawings. It should be noted that the relative arrangements of components and steps, numerical expressions and numerical values set forth in the embodiments are not intended to limit the scope of the present disclosure unless otherwise specified.

The following description of at least one exemplary embodiment is merely illustrative, and not as any limitations on the present disclosure and its application or use.

Techniques, methods and instruments known to those skilled in the art may not be discussed in detail, but where appropriate, the techniques, methods and instruments should be considered as part of the specification.

In all of the examples illustrated and discussed herein, any specific values should be construed as merely illustrative, and not as a limitation. Thus, other examples of the exemplary embodiments may have different values.

It should be noted that similar reference numerals and letters refer to similar items in the following figures, and therefore, once an item is defined in a figure, it is not required to be further discussed in the subsequent figures.

Figure 2:
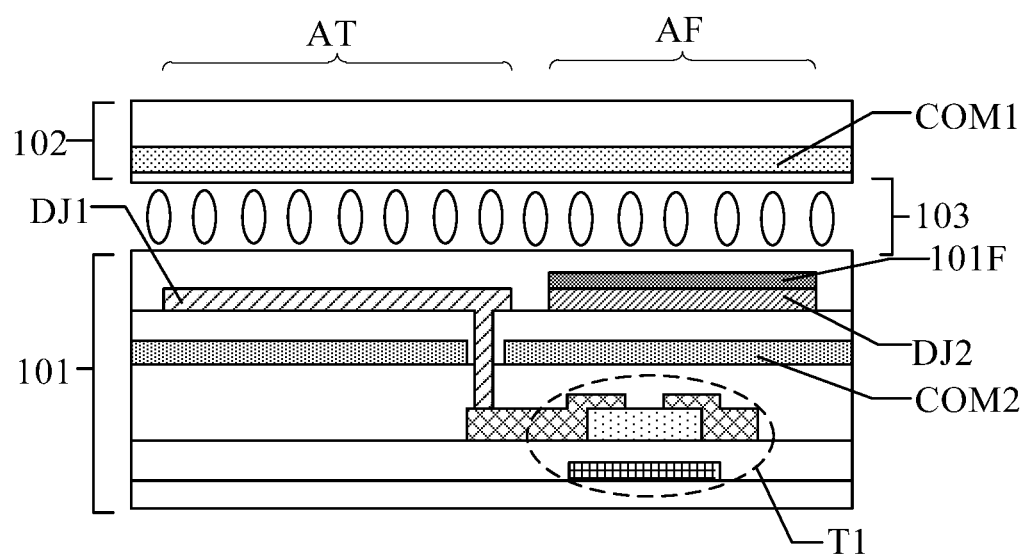
FIG. 2 illustrates a simplified cross-sectional schematic along a cross-sectional line A-A' in FIG. 1.

FIG. 1 illustrates a local schematic of a display panel of an optional embodiment according to embodiments of the present disclosure. FIG. 2 illustrates a simplified cross-sectional schematic along a cross-sectional line A-A' in FIG. 1.

Referring to FIG. 1, the display panel may include a display region AA. The display region AA may include transmissive regions AT and reflective regions AF. Each transmissive region AT may include color sub-pixels sp1. Optionally, the color sub-pixels sp1 may include red sub-pixels, blue sub-pixels and green sub-pixels. Each reflective region AF may include black-and-white sub-pixels sp2. It should be noted that only one arrangement of the transmissive regions AT and the reflective regions AF may be illustrated in FIG. 1, which may not be limited according to various embodiments of the present disclosure, and any other arrangements may be included in the present disclosure. The relative sizes of the color sub-pixels sp1 and the black-and-white sub-pixels sp2 in FIG. 1 may also merely illustrative. In the present disclosure, the transmissive region AT may be understood to be a region used for implementing display through a transmission method, and the reflective region AF may be understood to be a region used for implementing display through a reflection method.

As shown in FIG. 2, the display panel may further include an array substrate 101, a color film substrate 102 which are opposite to the array substrate 101, and a liquid crystal layer 103 between the array substrate 101 and the color film substrate 102. A first common electrode COM1 may be configured in the color film substrate 102 corresponding to all of the transmissive regions AT and the reflective regions AF. A black matrix (not shown in FIG. 2) may be configured in the color film substrate and may divide the display region into a plurality of the color sub-pixels and a plurality of the black-and-white sub-pixels. Color resists may also be configured at the positions corresponding to the color sub-pixels in the color film substrate.

Referring to FIG. 2, a plurality of first pixel electrodes DJ1 (only one first pixel electrode illustrated in FIG. 2) may be configured to be spaced apart from one another and in a portion of the array substrate 101 corresponding to the transmissive regions AT. The first pixel electrodes DJ1 may be electrically connected to the color sub-pixels sp1. At the color display phase, a vertical electric field may be formed after voltages are applied to the first pixel electrodes DJ1 and the first common electrode COM1, respectively. Liquid crystal molecules in the liquid crystal layer 103 may be deflected by the electric field, and light may pass through the liquid crystal layer, thereby implementing the display of the color sub-pixels sp1.

Referring to FIG. 2, a plurality of second pixel electrodes DJ2, a reflective layer 101F and a plurality of first thin-film transistors T1 may be configured in a portion of the array substrate 101 corresponding to the reflective regions AF. The second pixel electrodes DJ2 may be electrically connected to the black-and-white sub-pixels sp2. The reflective layer 101F may be on a side of the second pixel electrodes DJ2 adjacent to the liquid crystal layer 103. Optionally, the reflective layer 101F may be made of a metal having a relatively high reflectance, including Al, Ag, etc. At the black-and-white display phase, a voltage is applied to the second pixel electrodes DJ2, and the reflective layer 101F may reflect the ambient light illuminated thereon and then emit the light, thereby implementing the display of the black-and-white sub-pixels sp2. The first thin-film transistors T1 may be on a side of the second pixel electrodes DJ2 away from the liquid crystal layer 103. One first thin-film transistor T1 may be electrically connected to one first pixel electrode DJ1, that is, the first thin-film transistor T1 may be understood as a switch transistor which may control the switching of the color sub-pixels sp1. The first thin-film transistors T1 controlling the color sub-pixels sp1 may be configured at a position corresponding to the reflective regions AF in the present disclosure, that is, it is equivalent that the first thin-film transistors T1 may be configured directly under the second pixel electrodes DJ2. The blackand-white sub-pixels sp2 may implement the display using the reflection method in the present disclosure, that is, a backlight may not be required to be turned on during the display. When the color sub-pixels sp1 perform the display, no display may be performed in the reflective regions AF (that is, the position corresponding to the black-and-white sub-pixels sp2), so the reflective regions AF may be the non-light-emitting region during the color display of the display panel. The first thin-film transistors T1 may be configured at the non-light-emitting region during the color display, which may not occupy the space of the light-emitting region of the color sub-pixels sp1 and may be advantageous to improve the aperture ratio of the color display.

A second common electrode COM2 may be configured in the array substrate 101 corresponding to all of the transmissive regions AT and the reflective regions AF. Along the direction perpendicular to the array substrate 101, the second common electrode COM2 may be between the first thin-film transistors T1 and the second pixel electrodes DJ2. Since the second common electrode is also configured in the array substrate corresponding to the transmissive regions AT, it should be understood that the second common electrode COM2 may extend from between the first thin-film transistors T1 and the second pixel electrodes DJ2 to a side of the second pixel electrodes DJ2 away from the liquid crystal layer 103, that is, the second common electrode COM2 may be between the film layer having the first thin-film transistors T1 and the film layer having the first pixel electrodes DJ1. A same voltage signal may be applied to the second common electrode COM2 and the first common electrode COM1. The first common electrode COM1 and the second common electrode COM2 may be configured according to all of the transmissive regions AT and the reflective regions AF in the present disclosure. The same positive and negative inverted AC (alternating current) voltage signals may be applied to the second common electrode COM2 and the first common electrode COM1 during the working mode.

When at the color display, voltage signals may be applied to the first pixel electrodes DJ1, and same voltage signals may be applied to the second common electrode COM2 and the first common electrode COM1. At the transmissive regions AT, an electric field for controlling the deflection of liquid crystal molecules may be formed between the first pixel electrodes DJ1 and the corresponding first common electrode COM1, and a coupling capacitance may be formed between the first pixel electrodes DJ1 and the corresponding second common electrode COM2. In one case that the reflective regions AF are at normally-black mode, same voltage signals, which are jumping AC voltage signals, may be applied to the second common electrode COM2 and the first common electrode COM1 at the reflective regions AF, and currently no voltage signal may be applied to the second pixel electrodes DJ2. Therefore, a coupling capacitance may be formed between the second common electrode COM2 and the second pixel electrodes DJ2. The coupling capacitance may jump with the same frequency as the voltage signals on the second common electrode COM2, which may ensure that the second pixel electrodes and the first common electrode COM2 may maintain the same voltages, thereby preventing the jumping voltage signals on the first common electrode COM1 in the reflective regions AF from causing the voltage differences, which may generate the deflection of liquid crystal molecules, between the first common electrode and the second pixel electrodes. In addition, it may ensure that light may not be leaked out from the reflective regions AF when performing the color display, thereby avoiding the abnormal display. Optionally, a ½ λ waveplate may be configured at the position corresponding to the reflective regions AF. The normally-black mode of the reflective regions may be implemented through a structure of an upper polarizer and ½ λ waveplate, where the structure is a technical method which may be understood by those skilled in the art and will not be described in detail herein. In one case that the reflective regions AF is at normally-white mode, no voltage signal may also be applied to the second pixel electrodes DJ2 when the display panel performs the color display. Same voltage signals may be applied to the second common electrode COM2 and the first common electrode COM1 at the reflective regions AF, so the liquid crystal molecules corresponding to the reflective area AF may not be deflected. Or, voltage signals may also be applied to the second pixel electrodes DJ2 when the display panel performs the color display, so the liquid crystal molecules corresponding to the reflective regions AF may be deflected by 45°. Currently, the ambient light may become linearly polarized light after passing through the upper polarizer and then pass through the liquid crystal molecules to reach the reflective layer, and then pass through the liquid crystal molecules for the second time to reach the upper polarizer after being reflected by the reflective layer. After the linearly polarized light passes through the liquid crystal molecular layer twice, the polarization direction may be deflected by 90°. Currently, the exit light may be perpendicular to the transmission axis of the upper polarizer, so the exit light may not pass through the upper polarizer again. That is, the reflective regions AF may be displayed in the black mode, thereby ensuring no light leaked out from the reflective regions AF and also avoiding the abnormal display when performing the color display.

When at the black-and-white display, voltage signals may be applied to the second pixel electrodes DJ2; no voltage signal may be applied to the first pixel electrodes DJ1; and same voltage signals may be applied to the second common electrode COM2 and the first common electrode COM1. Regardless of whether the reflective regions AF is the normally-black mode or the normally-white mode, in order to implement the black-and-white display, it may be required to apply voltage signals to a portion of the second pixel electrodes to control the deflection of the liquid crystal molecules corresponding to the portion of the reflective regions AF, thereby distinguishing the reflective regions AF from displaying the black color or the white color. When the reflective regions AF are at the normally-black mode, the voltage signals may be applied to the second pixel electrodes DJ2, and an electric field which controls the deflection of the liquid crystal molecules may be formed between the second pixel electrodes DJ2 and the corresponding first common electrode COM1. For example, the liquid crystal molecules may be deflected by 45°. The ambient light may first become the linearly polarized light by the action of the upper polarizer, and then the linearly polarized light may be deflected by 45° along the polarization direction after passing through the liquid crystal molecular layer for one time. After reaching the reflective layer, the linearly polarized light may pass through the liquid crystal molecular layer for the second time and may be deflected by 45° along the polarization direction again after being reflected by the reflective layer. That is, the linearly polarized light may reach the upper polarizer after being deflected by 90°. After the ½ λ waveplate is added to the upper polarizer, the linearly polarized light may be emitted to implement that the reflective regions AF may display the white color. When the reflective regions AF are in the normally-white mode, the voltage signals may be applied to the second pixel electrodes DJ2, and an electric field which controls the deflection of the liquid crystal molecules may be formed between the second pixel electrodes DJ2 and the corresponding first common electrode COM1. For example, the liquid crystal molecules may be deflected by 45°. The ambient light may first become the linearly polarized light by the polarization action of the upper polarizer, and then may pass through the liquid crystal molecular layer, be reflected by the reflective layer and pass through the liquid crystal molecular layer for the second time, sequentially. Then, the linearly polarized light may reach the upper polarizer and may not pass through the upper polarizer again to emit light after being deflected by 90° along the polarization direction. Currently, the reflective regions AF may display the black color. When performing the black-and-white display, no voltage signal may be applied to the first pixel electrodes DJ1 in the reflective regions AF. The same voltage signals may be applied to the second common electrode COM2 and the first common electrode COM1, and the first pixel electrodes DJ1 may overlap the second common electrode COM2, so the coupling capacitance may be formed between the first pixel electrodes DJ1 and the second common electrode COM2. The coupling capacitance may ensure that no voltage difference may be between the first pixel electrodes DJ1 and the first common electrode COM1, and the jumping AC voltages on the first common electrode COM1 in the reflective regions AF may be prevented from causing false deflection of the liquid crystal molecules. Therefore, the light may not be leaked out from the reflective regions AF, and the abnormal display may be avoided during the black-and-white display.

The second common electrode corresponding to all of the transmissive regions and reflective regions may be configured in the present disclosure, and the same voltage signals may be applied on the second common electrode and the first common electrode. Therefore, the voltage difference between the first common electrode and the second pixel electrodes in the reflective regions may be avoided when performing the color display, which may cause the liquid crystal molecules corresponding to the reflective regions to be deflected, resulting in the light leakage from the reflective regions; in addition, the voltage difference between the first common electrode and the first pixel electrodes in the transmissive regions may be avoided when performing the black-and-white display, which may cause the liquid crystal molecules corresponding to the transmissive regions to be deflected, resulting in the light leakage from the transmissive regions. In the present disclosure, the switch between the color display and the black-and-white display may be implemented, and the abnormal color display and the abnormal black-and-white display may be avoided, thereby ensuring the reliability of the display performance. The second common electrode may be configured between the film layer having the first thin-film transistors and the film layer having the first pixel electrodes. The capacitance calculation formula is $C=\varepsilon S/4\pi kd$, where C is the capacitance value, $\varepsilon$ is the dielectric constant of a medium, S is the overlapping area of two capacitor plates, k is the electrostatic constant, and d is the distance between two capacitor plates. According to the capacitance calculation formula, it can be noted that the smaller the d is, the larger the C is. The design in the present disclosure may ensure that the distance respectively between the second common electrode and each of the first pixel electrode and the second pixel electrode along the direction perpendicular to the array substrate may be small. Therefore, the coupling capacitance formed by the second common electrode and the first pixel electrodes may be sufficiently large, and the first pixel electrodes and the first common electrode may be ensured to maintain the same voltages during the black-and-white display, thereby avoiding the false deflection of the liquid crystal molecules in the transmissive regions and effectively avoiding the abnormal display during the black-and-white display; simultaneously, the coupling capacitance formed by the second common electrode and the second pixel electrodes may be sufficiently large during the color display, and the second pixel electrodes and the first common electrode may be ensured to maintain the same voltages, thereby avoiding the false deflection of the liquid crystal molecules in the reflective regions and effectively avoiding the abnormal display during the color display.

In addition, only one display screen may be utilized to implement the switching between the black-and-white display and the color display in the present disclosure. Compared with the related technology, the manufacturing cost of the display panel may be reduced, and the thickness reduction of the display panel may be implemented.

Optionally, in the present disclosure, the first pixel electrodes and the second pixel electrodes may be configured in a same single layer, that is, may be fabricated by a same process. The plurality of the first pixel electrodes and the plurality of the second pixel electrodes may be formed in a same etching process. Optionally, the first pixel electrodes and the second pixel electrodes may be configured in different layers.

In the present disclosure, the plurality of the color sub-pixels may be arranged along a first direction to form one or more color sub-pixel rows, and the plurality of the black-and-white sub-pixels may be arranged along the first direction to form one or more black-and-white sub-pixel rows. The black-and-white sub-pixel row may be between two adjacent color sub-pixel rows. In the present disclosure, the black-and-white sub-pixels may be arranged into the black-and-white sub-pixel rows and the color sub-pixels may be arranged into the color sub-pixel rows. That is, the black-and-white sub-pixels and the color sub-pixels may be arranged regularly, which may be advantageous to improve the display effect of patterns formed by the plurality of the black-and-white sub-pixels during the black-and-white display and the display effect of color patterns formed by the plurality of the color sub-pixels during the color display.

Figure 3:
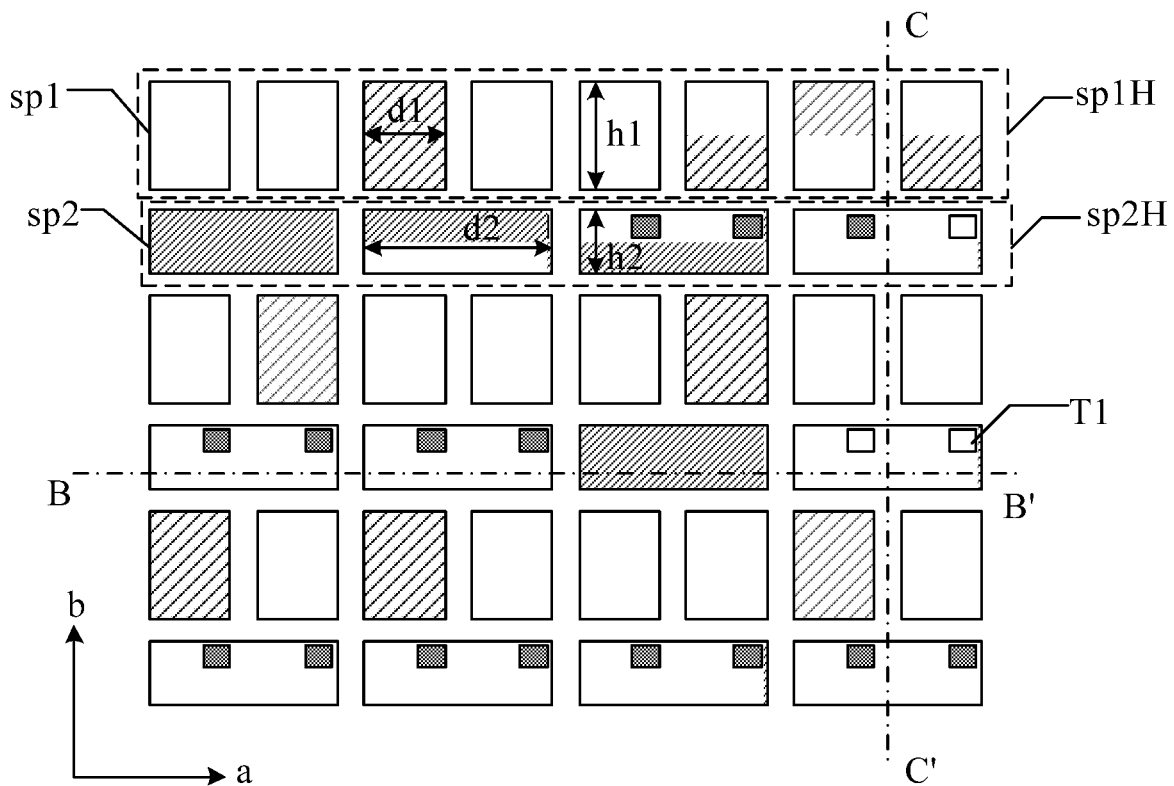
FIG. 3 illustrates a local schematic of a display region of a display panel of another optional embodiment according to embodiments of the present disclosure.

In one embodiment, FIG. 3 illustrates a local schematic of a display region of a display panel of another optional embodiment according to embodiments of the present disclosure. As shown in FIG. 3, the plurality of the color sub-pixels sp1 may be arranged along a first direction a to form one or more color sub-pixel rows sp1H, and the plurality of the black-and-white sub-pixels sp2 may be arranged along the first direction a to form one or more black-and-white sub-pixel rows sp2H. The black-and-white sub-pixel row sp2H may be between two adjacent color sub-pixel rows sp1H. The black-and-white sub-pixel rows sp2H and the color sub-pixel rows sp1H may be alternately arranged along a second direction b. The second direction b may intersect the first direction a. In one embodiment, the black-and-white sub-pixel rows and the color sub-pixel rows may be alternately arranged, which may be advantageous to improve the display effect of patterns formed by the plurality of the black-and-white sub-pixels during the black-and-white display and the display effect of color patterns formed by the plurality of the color sub-pixels during the color display.

Figure 4:
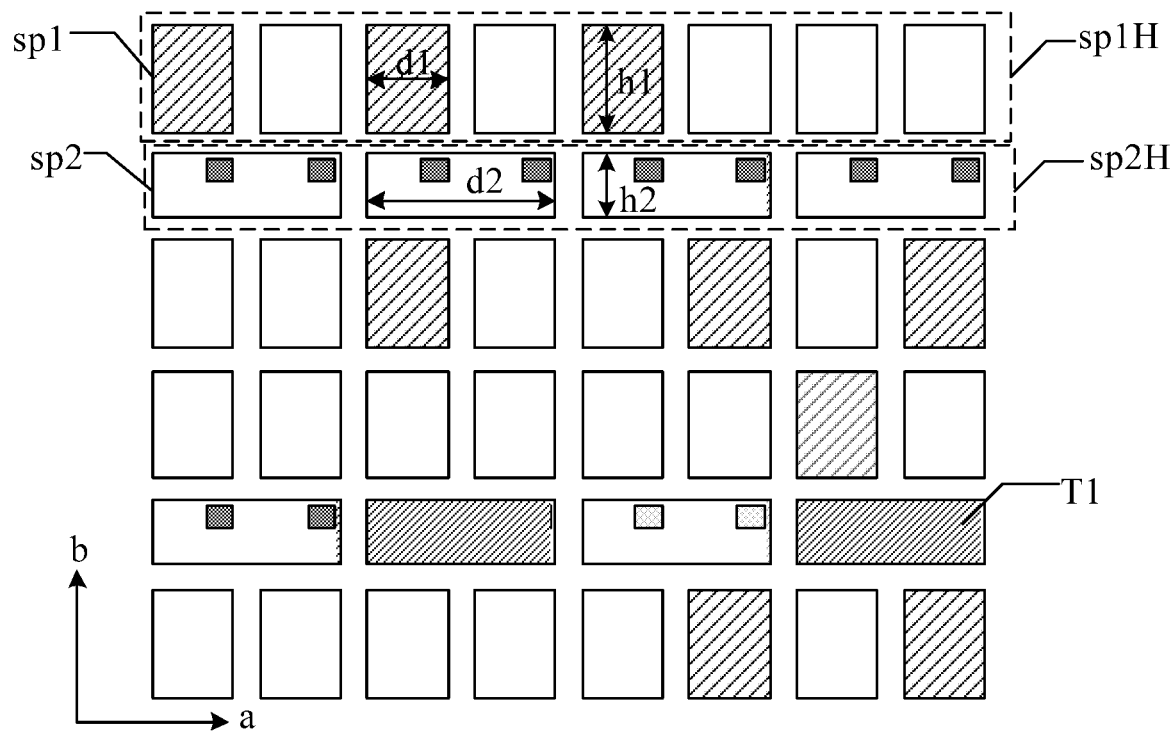
FIG. 4 illustrates a top-view schematic of a display panel of another optional embodiment according to embodiments of the present disclosure.

In one embodiment, FIG. 4 illustrates a top-view schematic of a display panel of another optional embodiment according to embodiments of the present disclosure. As shown in FIG. 4, the plurality of the color sub-pixels sp1 may be arranged along the first direction a to form the color sub-pixel row sp1H, and the plurality of the black-and-white sub-pixels sp2 may be arranged along the first direction a to form the black-and-white sub-pixel row sp2H. The black-and-white sub-pixel row sp2H may be between two adjacent color sub-pixel rows sp1H. Two color sub-pixel rows sp1H may be configured between two adjacent black-and-white sub-pixel rows sp2H along the second direction b. The second direction b may intersect the first direction a. The embodiment may be applied to the display panel with high pixel density. The two color sub-pixel rows sp1H may be configured between the two adjacent black-and-white sub-pixel rows sp2H, which may ensure the display effect of patterns during the black-and-white display and also ensure the sufficient configured density of the color sub-pixels.

In order to achieve color richness, the small-sized color sub-pixels may be required to be configured during the color display. However, only two colors, which are the black color and the white color, may be required during the black-and-white display. Therefore, the areas of the black-and-white pixels may be designed to be relatively large, and the plurality of the black-and-white sub-pixels may also be required to be displayed simultaneously to form desirable display patterns during the black-and-white display. In the display panel, provided by the present disclosure, capable of implementing the switching between the color and the black-and-white, sizes of the black-and-white sub-pixels and the color sub-pixels may be further defined.

Furthermore, a width of the color sub-pixel sp1 is d1 and a width of the black-and-white sub-pixel sp2 is d2 along the first direction, where $d2 \geq n*d1$, n is a positive integer, and $n \geq 1$. Referring to FIG. 3 or FIG. 4, n=2 may be used for illustration. In the present disclosure, the color sub-pixels may be arranged to form the color sub-pixel row sp1H and the black-and-white sub-pixels may be arranged to form the black-and-white row sp2H along the first direction a. The width of one black-and-white sub-pixel may be equal to the width of one color sub-pixel, or the width of one black-and-white sub-pixel may be greater than or equal to the width of n color sub-pixels. In practical applications, the width of the black-and-white pixel may be designed according to the pattern shapes required to be displayed during the black-and-white display, and widths of all the black-and-white sub-pixels may also be different in a same display panel.

Furthermore, a height of the color sub-pixel sp1 may be h1 and a height of the black-and-white sub-pixel sp2 may be h2 along the second direction b, where h1>h2 and the second direction b may intersect the first direction a. Referring to FIG. 3 or FIG. 4, the color display may be the display in the normal working mode of the display panel, and the black-and-white display may be the display in the standby mode. In addition, the region having the black-and-white sub-pixels during the color display may be the non-light-emitting region during the color display. In the present disclosure, the height of the color sub-pixel may be designed to be greater than the height of the black-and-white sub-pixel, which may ensure that the non-light-emitting region between adjacent color sub-pixel rows may be narrow, and also ensure that the display effect during the color display may not be affected.

Figure 5:
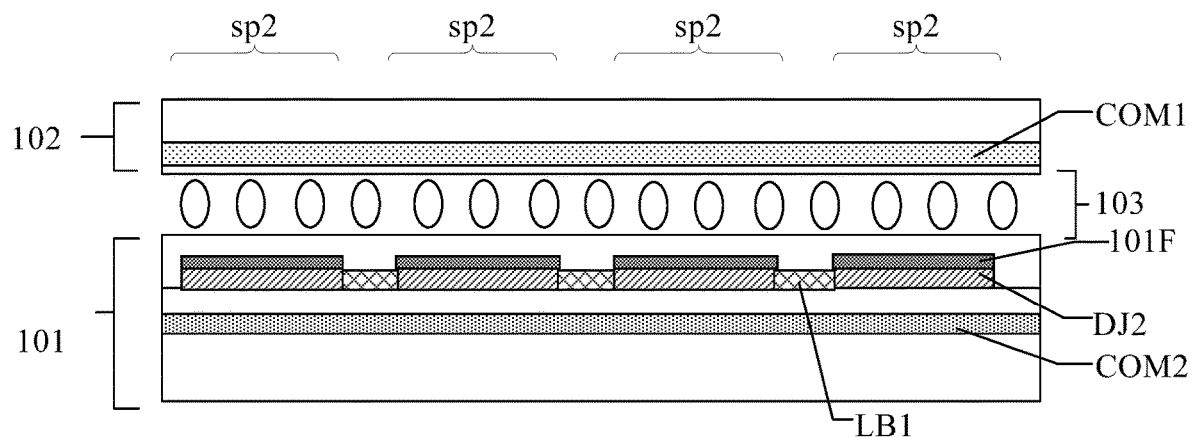
FIG. 5 illustrates a cross-sectional schematic of an optional embodiment along a cross-sectional line B-B' in FIG. 3.

In one embodiment, for the same black-and-white pixel row, m second pixel electrodes of at least m black-and-white sub-pixels, sequentially adjacent to one another, may be electrically connected to one another, where m is a positive integer and $m \geq 1$. Referring to FIG. 5, FIG. 5 illustrates a cross-sectional schematic of an optional embodiment along a cross-sectional line B-B' in FIG. 3. Taking m=4 as an example, two adjacent second pixel electrodes DJ2 may be electrically connected through a first connecting portion LB1, so 4 second pixel electrodes DJ2 of 4 black-and-white sub-pixels, sequentially adjacent to one another along the first direction a, may be electrically connected to one another. When fabricating the second pixel electrodes DJ2, no other structural components may be required to be configured between the two adjacent second pixel electrodes DJ2 in the same black-and-white pixel row. In addition, the first connecting portion connecting the two adjacent second pixel electrodes may be configured in a same single layer as the second pixel electrodes, that is, the pattern of the second pixel electrodes and the pattern of the first connecting portions may be etched and formed in a same etching process by adjusting the mask shapes. Optionally, the first connecting portions and the second pixel electrodes may be configured in different layers, so vias may be required to connect the first connecting portions with the second pixel electrodes, which may not be illustrated in the drawings. The plurality of the black-and-white sub-pixels may be required to form needed patterns to-be-displayed during the black-and-white display by splicing. That is, it is necessary that the voltage signals may be simultaneously applied to the second pixel electrodes of the plurality of the black-and-white sub-pixels, and second data signal lines electrically connected to the second pixel electrodes may be configured in the array substrate, where the second data signal lines may supply data voltage signals to the second pixel electrodes. In one embodiment of the present disclosure, for the same black-and-white pixel row, m second pixel electrodes of m black-and-white sub-pixels, sequentially adjacent to one another, may be electrically connected to one another, so the voltage signals may be simultaneously supplied to the m second pixel electrodes, which may be advantageous to reduce the number of the second data signal lines electrically connected to the second pixel electrodes, and simplify the circuit wiring in the array substrate.

Figure 6:
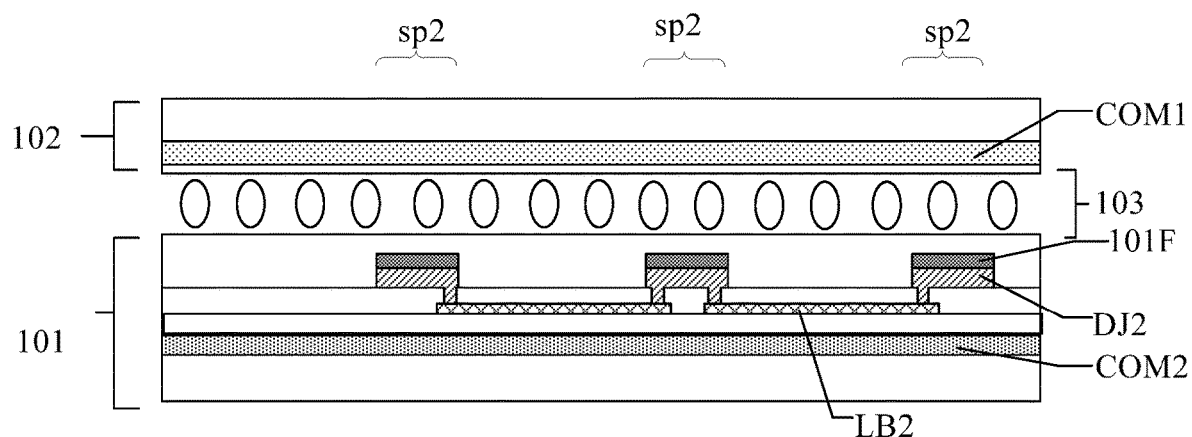
FIG. 6 illustrates a cross-sectional schematic of an optional embodiment along a cross-sectional line C-C' in FIG. 3.

In one embodiment, p second pixel electrodes of at least p black-and-white sub-pixels, sequentially adjacent to one another along the second direction, may be electrically connected to one another, where p is a positive integer and $p \geq 1$. Referring to FIG. 6, FIG. 6 illustrates a cross-sectional schematic of an optional embodiment along a cross-sectional line C-C' in FIG. 3. Taking p=3 as an example, two adjacent second pixel electrodes DJ2 may be electrically connected through a second connecting portion LB2. As shown in FIG. 6, the second connecting portions LB2 and the second pixel electrodes DJ2 may be configured in different layers, and the second connecting portions LB2 may be connected to the second pixel electrodes DJ2 through vias. The second connecting portions LB2 may be required to be fabricated using a metal material or a metal oxide material having electrical conductivity, and refer to the position of the cross-sectional line C-C' in FIG. 3, so it may be noted that the second connecting portion LB2 may be between two adjacent color sub-pixels sp1, where the position design may ensure that the second connecting portions LB2 may be configured in the non-light-emitting region during the color display, thereby avoiding the impact on the aperture ratio of the color sub-pixels. Optionally, the second connecting portions LB2 and the second pixel electrodes DJ2 may be configured in the same layer, that is, the pattern of the second pixel electrodes and the pattern of the second connecting portions may be etched and formed in the same etching process, which may not be illustrated in the drawings.

The plurality of the black-and-white sub-pixels may be required to form needed patterns to-be-displayed during the black-and-white display by splicing. That is, it is necessary that the voltage signals may be simultaneously applied to the second pixel electrodes of the plurality of the black-and-white sub-pixels, and second data signal lines electrically connected to the second pixel electrodes may be configured in the array substrate, where the second data signal lines may supply the data voltage signals to the second pixel electrodes. In one embodiment of the present disclosure, p second pixel electrodes of p black-and-white sub-pixels, sequentially adjacent to one another along the second direction, may be electrically connected to one another, so the voltage signals may be simultaneously supplied to the p second pixel electrodes, which may be advantageous to reduce the number of the second data signal lines electrically connected to the second pixel electrodes, and simplify the circuit wiring in the array substrate.

In the present disclosure, the display panel may include a non-display region surrounding the display region. The non-display region may include a first drive chip and a second drive chip. The first drive chip may be used to provide the data drive signal to the transmissive regions and the second drive chip may be used to provide the data drive signal to the reflective regions. The signal lines used to provide the data drive signal to the transmissive regions may be first data signal lines, and the signal lines used to provide the data drive signal to the reflective regions may be second data signal lines. In the present disclosure, the film layer positions and the relative positions in the display region of the first data signal lines and the second data lines may vary and may be described in the following embodiments.

Figure 7:
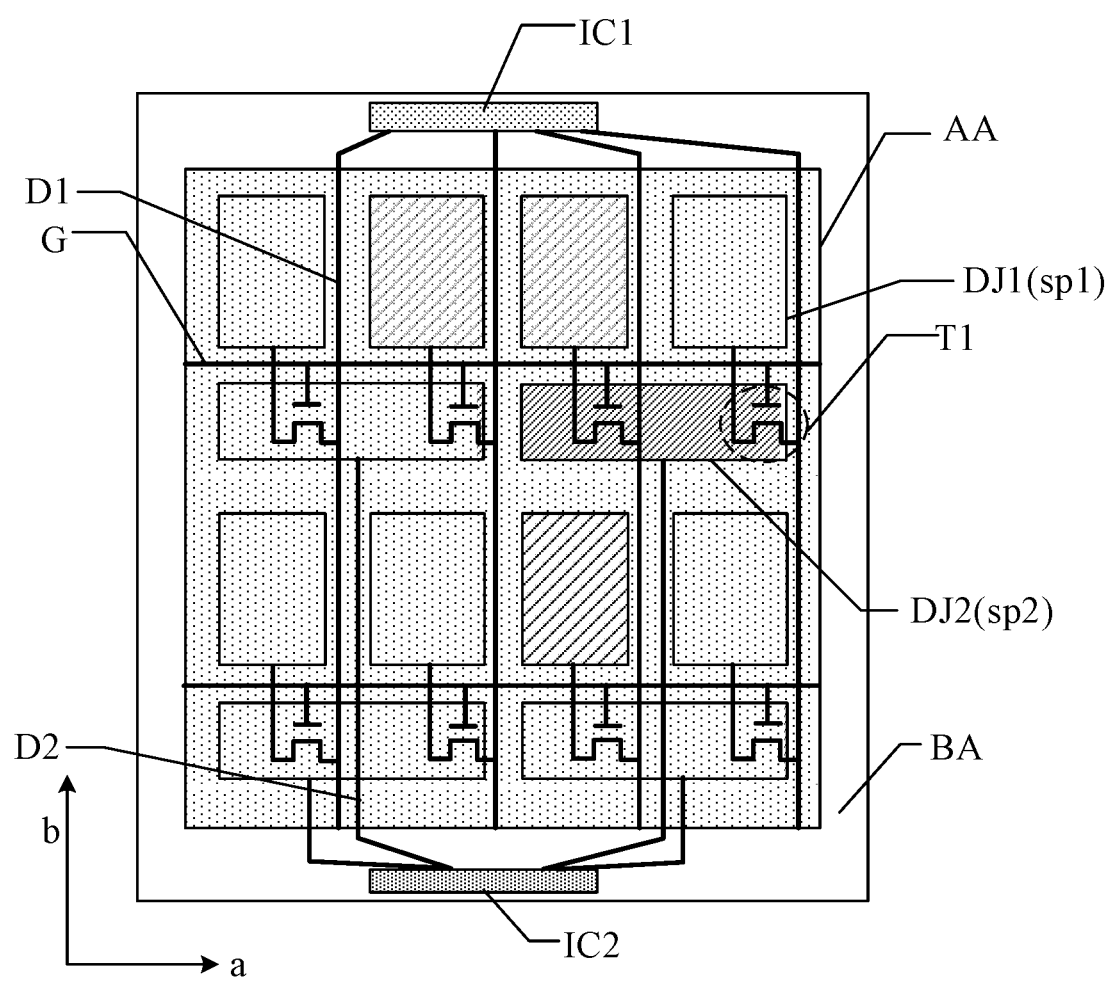
FIG. 7 illustrates a simplified schematic of a display panel of another optional embodiment according to embodiments of the present disclosure.

In one embodiment, FIG. 7 illustrates a simplified schematic of a display panel of another optional embodiment according to embodiments of the present disclosure. As shown in FIG. 7, only a portion of the color sub-pixels sp1 and a portion of the black-and-white sub-pixels sp2 may be illustrated in the display region AA, and any number of the color sub-pixels sp1 and the black-and-white sub-pixels may be included in the present disclosure. The array substrate may further include a plurality of scan lines G extending along the first direction a and a plurality of first data signal lines D1 and second data signal lines D2 extending along the second direction b, where the first direction may intersect the second direction. A gate of the first thin-film transistor T1 may be electrically connected to the scan line G; a drain of the first thin-film transistor T1 may be electrically connected to the first pixel electrode DJ1; one end of the first data signal line D1 may be electrically connected to a source of the first thin-film transistor T1, and the other end of the first data signal line D1 may be electrically connected to the first drive chip IC1; one end of the second data signal line D2 may be electrically connected to the second pixel electrode DJ2, and the other end of the second data signal line D2 may be electrically connected to the second drive chip IC2. In the display panel provided by one embodiment, the first data signal line may be electrically connected to the source of the first thin-film transistor, and the drain of the first thin-film transistor may be electrically connected to the first pixel electrode. In such way, the data drive signal may be provided to the color sub-pixels through the first data signal line, thereby implementing the active drive of the color display; and the data drive signal may be provided to the black-and-white sub-pixels through the second data signal line, thereby implementing the passive drive of the black-and-white display, which may be advantageous to reduce the power consumption. The black-and-white sub-pixels may not be controlled by the thin-film transistors, and each black-and-white sub-pixel may be electrically connected to the second drive chip IC2 directly, that is, the black-and-white display may be implemented by the passive drive. Moreover, the first data signal line may be connected to the first drive chip and the second data signal line may be connected to the second drive chip, so the active drive and the passive drive controlled by different drive chips may be implemented, which may be simple and convenient in design.

Optionally, referring to FIG. 7, the first drive chip IC1 and the second drive chip IC2 may be respectively in the non-display region BA on both sides of the display region AA along the second direction b. In one embodiment, the first drive chip and the second drive chip may be configured separately, so the space occupied by one side of non-display region caused by configuring the first and second drive chips on the one side of the non-display region may be avoided to be too large, which may affect the narrowing of the non-display region. Moreover, if the first drive chip and the second drive chip are configured in a same non-display region, a larger number of pins and signal leads may need to be configured in the non-display region simultaneously, which may increase the complexity of the circuit arrangement in the non-display region. However, the design of the present disclosure may be advantageous to simplify the complexity of the circuit arrangement in the non-display region.

Figure 8:
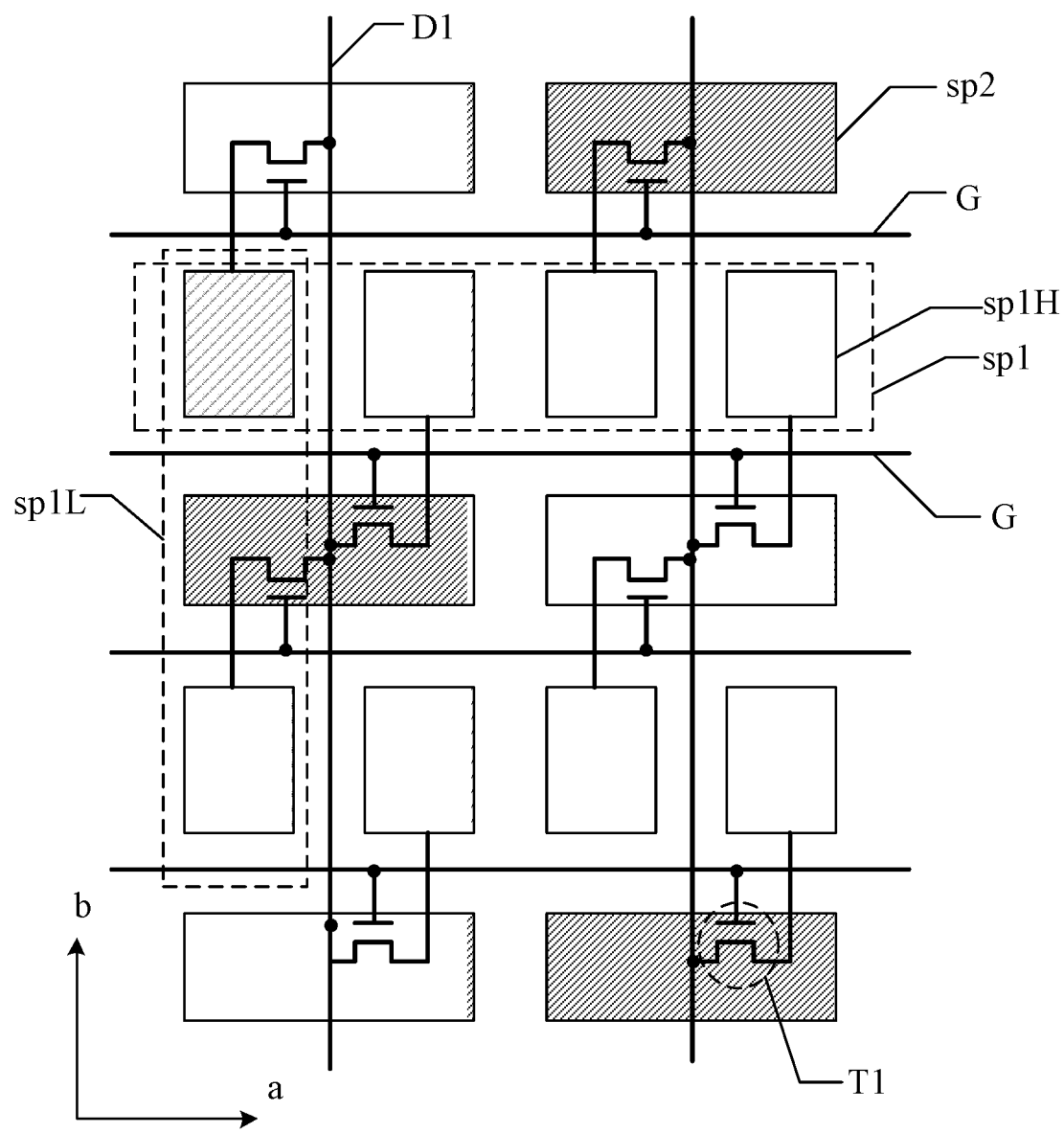
FIG. 8 illustrates a local simplified schematic of a display panel of another optional embodiment according to embodiments of the present disclosure.

In one embodiment, FIG. 8 illustrates a local simplified schematic of a display panel of another optional embodiment according to embodiments of the present disclosure. As shown in FIG. 8, the plurality of the color sub-pixels sp1 may be arranged along the second direction b to form one or more color sub-pixel columns sp1L. One color sub-pixel row sp1H may be driven by two scan lines G. In the same color sub-pixel row sp1H, two adjacent color sub-pixels sp1 may be electrically connected to one same first data signal line D1 and connected to different scan lines G; and two adjacent color sub-pixel columns sp1L may share one first data signal line D1 along the first direction a. In one embodiment, the two adjacent color sub-pixel columns may share the one first data signal line, which may reduce the number of the first data signal lines configured in the display panel. Therefore, the number of pins on the first drive chip may be reduced, which may be advantageous to simplify the design of the first drive chip. Moreover, after the number of the first data signal lines is reduced, the first data signal lines may not be required to be configured in the region between two color sub-pixel columns which are adjacent to each other and driven by different first data signal lines in the display panel; and the second data signal lines may be configured in the region or a width of the region may be compressed along the first direction, that is, the area of the non-aperture region of the display panel may be reduced, thereby increasing the aperture ratio of the color display. The position of the second data signal lines may not be shown in FIG. 8. In the present disclosure, the second data signal line may be between two adjacent color sub-pixel columns. In the present disclosure, the two adjacent color sub-pixel columns may configured to share the one first data signal line, and the space for configuring the second data signal lines may be reserved between the two color sub-pixel columns which are adjacent to each other and connected to different first data signal lines. Therefore, the configuration of the second data signal lines may not affect the area of the non-aperture region of the display panel, and further may not affect the aperture ratio of the color display. The configuration positions of the second data signal lines may be exemplified in the following embodiments.

Figure 9:
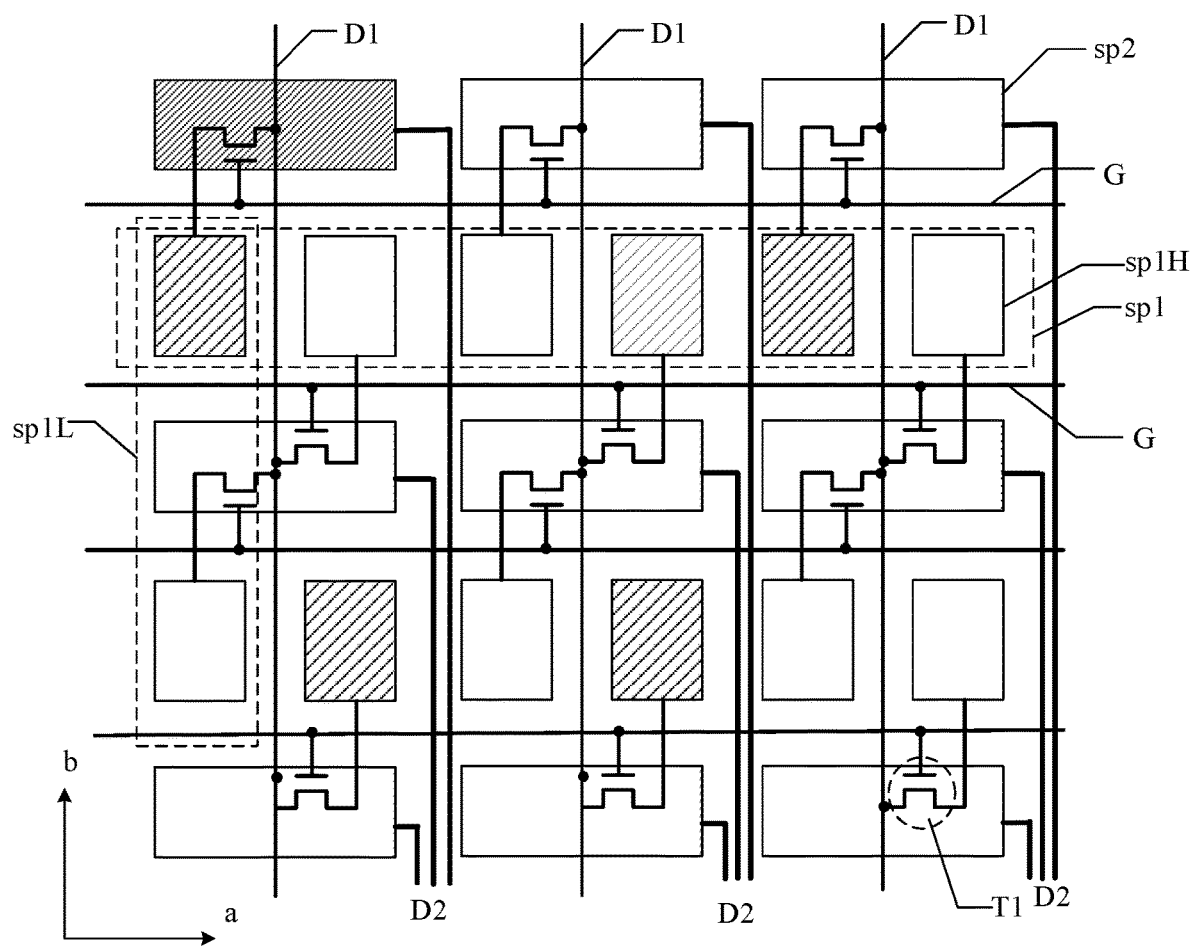
FIG. 9 illustrates a simplified schematic of a display panel of another optional embodiment according to embodiments of the present disclosure.

In one embodiment, FIG. 9 illustrates a simplified schematic of a display panel of another optional embodiment according to embodiments of the present disclosure. As shown in FIG. 9, the plurality of the color sub-pixels sp1 may be arranged along the second direction b to form one or more color sub-pixel columns sp1L; one color sub-pixel row sp1H may be driven by two scan lines G; in the same color sub-pixel row sp1H, two adjacent color sub-pixels sp1 may be electrically connected to one same first data signal line D1 and connected to different scan lines G; and two adjacent color sub-pixel columns sp1L may share one first data signal line D1 along the first direction a. One or more second data signal lines D2 may be configured between two adjacent first data signal lines D1. In FIG. 9, the width of the black-and-white sub-pixel may be approximately twice the width of the color sub-pixel along the first direction a for illustration, and the pixel arrangement in FIG. 9 may only be illustrative and any other arrangements may be included in the present disclosure. In a black-and-white sub-pixel row, one black-and-white sub-pixel sp2 may be connected to one second data signal line D2 (shown in FIG. 9); or, two or more adjacent black-and-white sub pixels sp2 may be connected to one same second data signal line D2; or two or more adjacent second data signal lines D2 may be connected to one same black-and-white sub-pixel sp2. In one embodiment, the two adjacent color sub-pixel columns may share the one first data signal line, and the space for configuring the second data signal lines may be reserved in the display panel. Therefore, the configuration of the second data signal lines may not affect the area of the non-aperture region of the display panel, and further not affect the aperture ratio of the color display.

Figure 10:
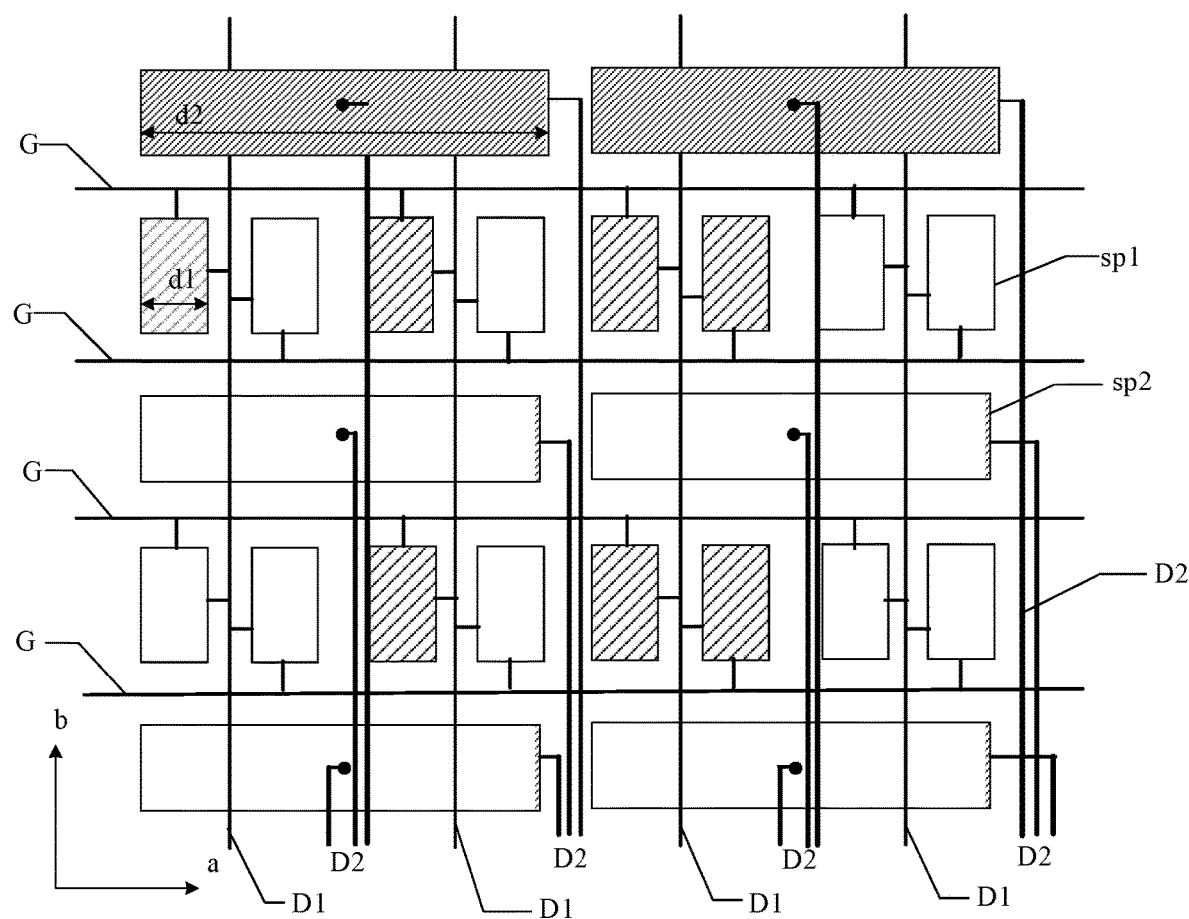
FIG. 10 illustrates a simplified schematic of a display panel of another optional embodiment according to embodiments of the present disclosure.

In one embodiment, the width of the color sub-pixel is d1 and the width of the black-and-white sub-pixel is d2 along the first direction, where d2≥n*d1, n is a positive integer, and n≥1. FIG. 10 illustrates a simplified schematic of a display panel of another optional embodiment according to embodiments of the present disclosure. As shown in FIG. 10, the width of the black-and-white sub-pixel sp2 may be approximately four times (e.g., n=4) the width of the color sub-pixel sp1 for illustration only, and any other width configuration may be included in the present disclosure; and one color sub-pixel row sp1H may be driven by two scan lines G. In a same color sub-pixel row sp1H, two adjacent color sub-pixels sp1 may be electrically connected to one same first data signal line D1 and connected to different scan lines, where the simplified illustration may be shown in FIG. 10 and the position of the first thin-film transistor may not be shown. One or more second data signal line D2 may be configured between two adjacent first data signal lines D1, and one black-and-white sub-pixel sp2 may be electrically connected to two second data signal lines D2. In one embodiment, it may illustrate that one black-and-white sub-pixel may be connected to at least two second data signal lines, and data signals may be provided for the same black-and-white sub-pixel through at least the two second data signal lines, which may ensure voltage uniformity on the second pixel electrode having a relatively large size (corresponding to the black-and-white pixel having a relatively large size).

Figure 11:
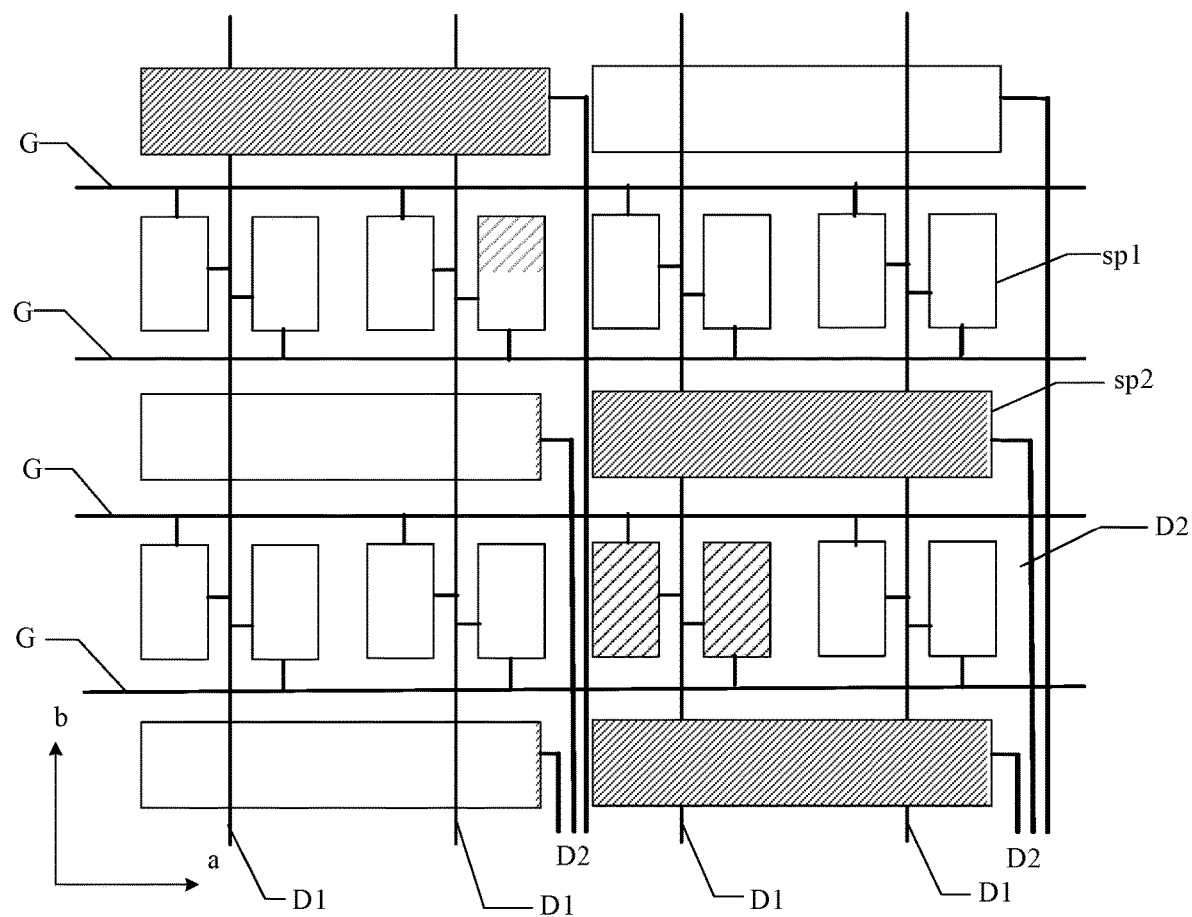
FIG. 11 illustrates a simplified schematic of a display panel of another optional embodiment according to embodiments of the present disclosure.
Figure 12:
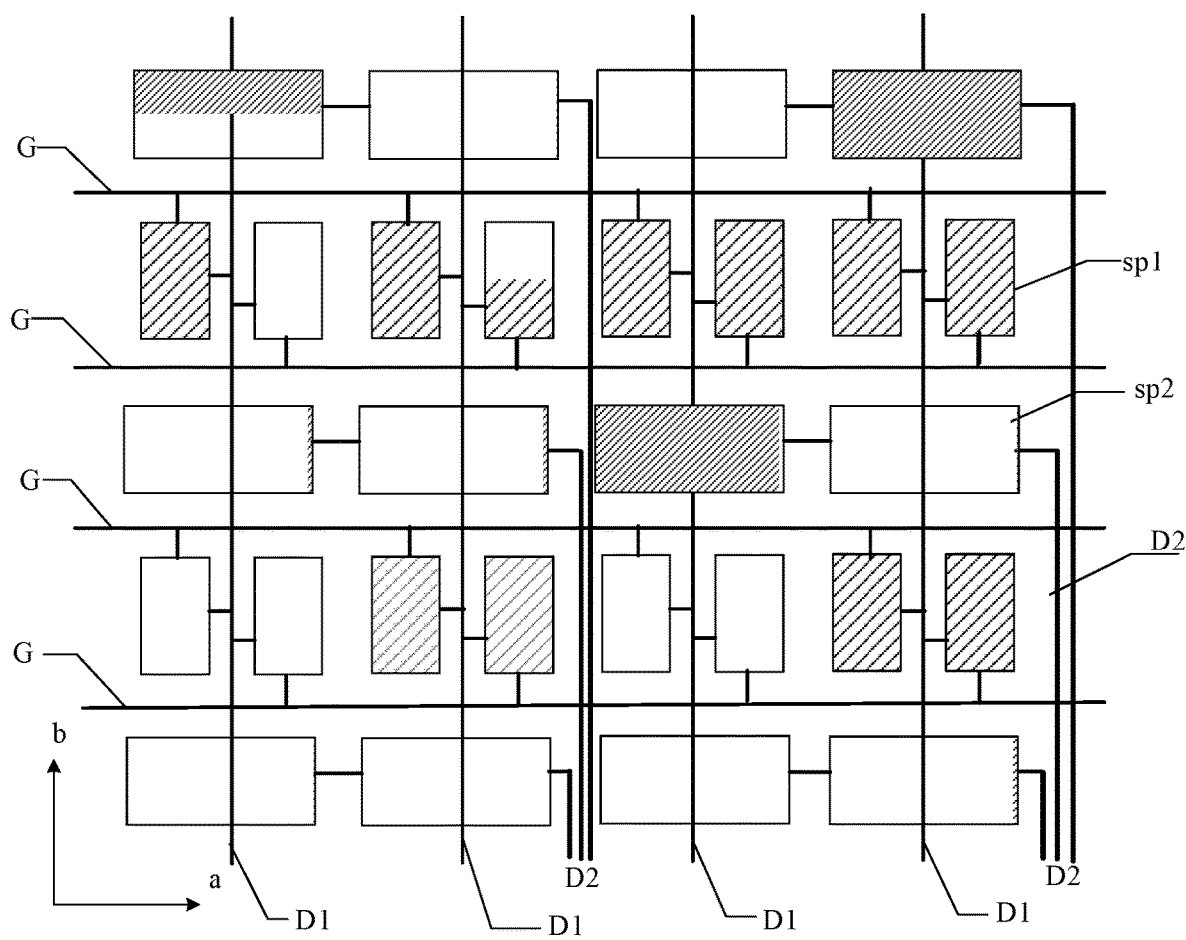
FIG. 12 illustrates a simplified schematic of a display panel of another optional embodiment according to embodiments of the present disclosure.

In one embodiment, one or more second data signal lines D2 may be configured between two adjacent first data signal lines D1. FIG. 11 illustrates a simplified schematic of a display panel of another optional embodiment according to embodiments of the present disclosure. As shown in FIG. 11, the plurality of the color sub-pixels sp1 may be arranged along the second direction b to form one or more color sub-pixel columns sp1L; one color sub-pixel row sp1H may be driven by two scan lines G; in the same color sub-pixel row sp1H, two adjacent color sub-pixels sp1 may be electrically connected to one same first data signal line D1 and connected to different scan lines G; and two adjacent color sub-pixel columns sp1L may share one first data signal line D1 along the first direction a. In FIG. 9, the width of the black-and-white sub-pixel may be approximately four times the width of the color sub-pixel along the first direction a for illustration only, and any other width configuration may be included in the present disclosure; and one or more second data signal lines D2 may be configured between two adjacent first data signal lines D1. FIG. 12 illustrates a simplified schematic of a display panel of another optional embodiment according to embodiments of the present disclosure. As shown in FIG. 12, the width of the black-and-white sub-pixel may be approximately twice the width of the color sub-pixel along the first direction a. Two adjacent black-and-white sub-pixels may be electrically connected to each other and may be connected to one second data signal line D2 along the first direction a. FIG. 11 and FIG. 12 may illustrate that one or more second data signal lines D2 may be configured between two adjacent first data signal lines D1. In one embodiment, two adjacent color cub-pixel columns may be configured to share one first data signal line at first, and the space for configuring the second data signal lines may be reserved between the two color sub-pixel columns which are adjacent to each other and connected to different first data signal lines. Furthermore, one or more second data signal lines may be configured between two adjacent first data signal lines. That is, neither the first data signal lines nor the second data signal lines may be configured between two adjacent color sub-pixel columns. In one embodiment, the spacing between two color sub-pixel columns, which are adjacent to each other along the first direction and not configured with the data signal lines, may be reduced, which may implement the area reduction of the non-aperture region during the color display, thereby improving the aperture ratio during the color display.

In some embodiments, the second data signal lines D2 and the first data signal lines D1 may be configured in a same single layer in the embodiments corresponding to FIG. 7, FIG. 9, FIG. 10, FIG. 11, and FIG. 12. That is, the patterns of the first data signal lines and the second data signal lines may be etched and formed by a same etching process. By using the same layer configuration, the process may be simple; an additional process may not be needed; and the film layer thickness of the display panel may not be increased, which may be advantageous to reduce the thickness of the display panel.

Figure 13:
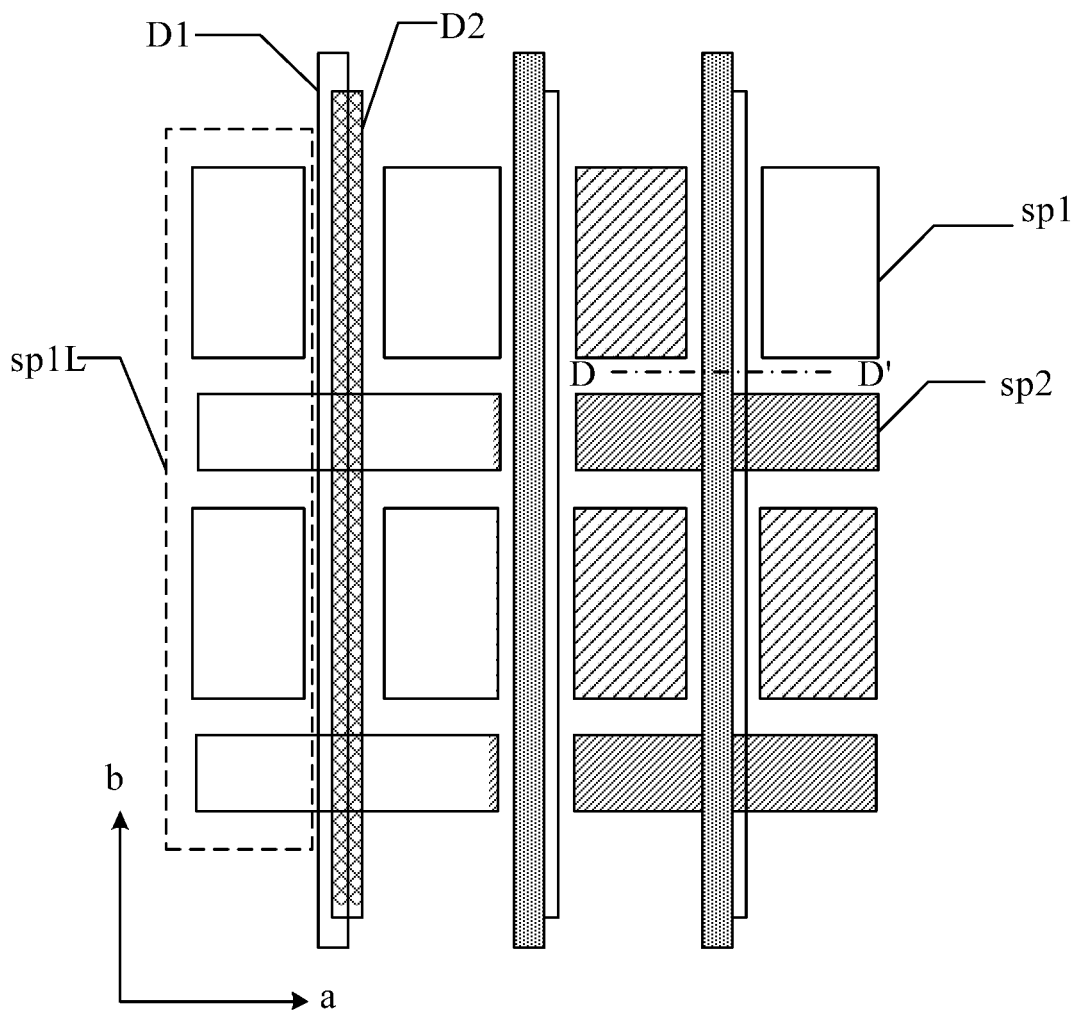
FIG. 13 illustrates a local schematic of a display panel of another optional embodiment according to embodiments of the present disclosure.
Figure 14:
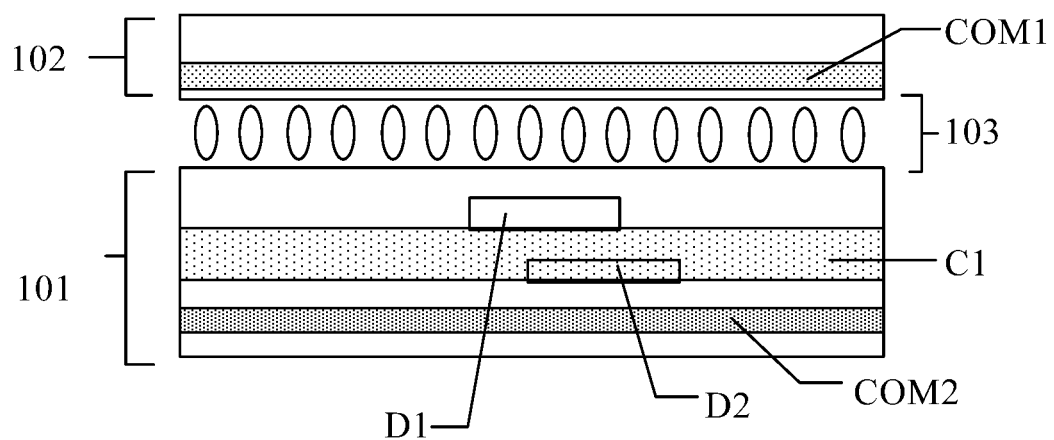
FIG. 14 illustrates a cross-sectional schematic of an optional embodiment along a cross-sectional line D-D' in FIG. 13.

In some embodiments, the second data signal lines D2 and the first data signal lines D1 may be configured in different layers in the embodiments corresponding to FIG. 7, FIG. 9, FIG. 10, FIG. 11, and FIG. 12. FIG. 13 illustrates a local schematic of a display panel of another optional embodiment according to embodiments of the present disclosure. FIG. 14 illustrates a cross-sectional schematic of an optional embodiment along a cross-sectional line D-D' in FIG. 13. A projection of the second data signal line on the array substrate may overlap a projection of the first data signal line on the array substrate along the direction perpendicular with the array substrate. The top-view direction is consistent with the projection direction, so the projection of the second data signal line on the array substrate may coincide with the second data signal line in the top-view schematic; the projection of the first data signal line on the array substrate may coincide with the first data signal line in the top-view schematic, so the projections may not be labeled in FIG. 13 and FIG. 14. For example, in the top-view schematic of FIG. 13, the second data signal line D2 may overlap the first data signal line D1, and it may be simplified in FIG. 13 that the first data signal line D1 and the second data signal line D2 may be between two adjacent color sub-pixel columns sp1L. Other wires in the display panel, the connections between the first data signal lines and the color sub-pixels, and the connections between the second data signal lines and the black-and-white sub-pixels may not be shown in FIG. 13.

Referring to FIG. 14, an insulation layer C1 may be configured between the first data signal line D1 and the second data signal line D2. In FIG. 14, it may merely illustrate that the film layer having the first data signal line D1 may be on a side of the film layer having the second data signal line D2 adjacent to the liquid crystal layer 103, and any other relative positions may be included in the present disclosure. Optionally, the film layer having the first data signal line D1 may be on a side of the film layer having the second data signal line D2 away from the liquid crystal layer 103. In one embodiment, it is equivalent that the first data signal line and the second data signal line may be stacked in the direction perpendicular to the array substrate, and the insulation layer may be used to insulate the first data signal line and the second data signal line which may prevent signal interference. The design may reduce the space occupied by both the first data signal line D1 and the second data signal line D2 in the first direction a in the top-view schematic, that is, the size of the non-light-emitting area during the color display may be reduced, which may be advantageous to improve the aperture ratio during the color display.

Figure 15:
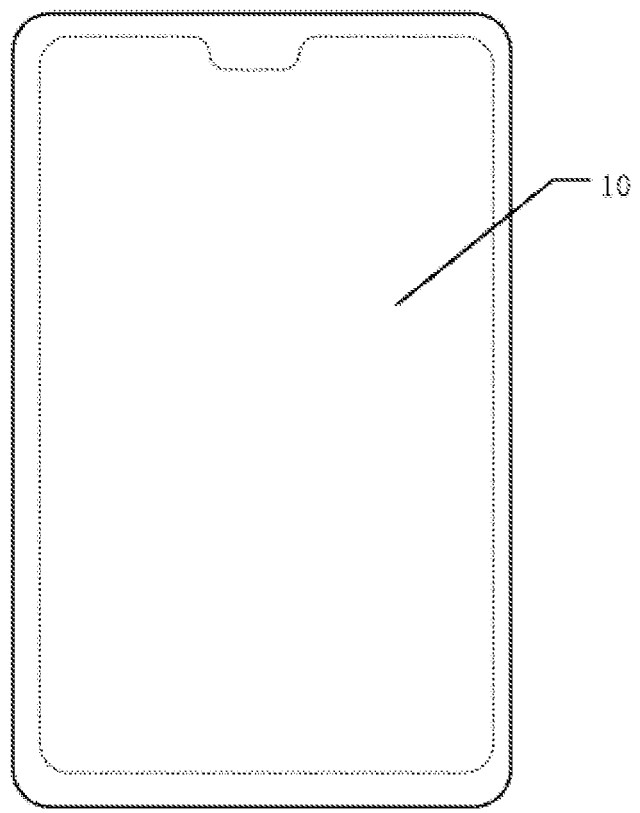
FIG. 15 illustrates a schematic of an exemplary display device according to the present disclosure.

A display device may also be provided in the embodiments of the present disclosure. FIG. 15 illustrates a schematic of an exemplary display device according to the present disclosure. A display device 10 provided in the various embodiments of the present disclosure may be included in FIG. 15. The display device provided by the embodiments of the present disclosure may be any electronic product having a display function, including but not limited to the following categories: a television, a notebook computer, a desktop display, a tablet, a digital camera, a mobile phone, a smart bracelet, a smart glasses, an in-vehicle display, a medical equipment, an industrial equipment, a touch interactive terminals, etc.

From the above-mentioned embodiments, it can be noted that the display panel and the display device provided by the present disclosure may achieve at least the following beneficial effects.

In the present disclosure, only one display screen may be utilized to implement the switching between the black-and-white display and the color display. Compared with the related technology, the manufacturing cost of the display panel may be reduced, and the thickness reduction of the display panel may be implemented. The display region of the display panel provided by the present disclosure may include the transmissive regions and the reflective regions. The first thin-film transistors electrically connected to the corresponding color sub-pixels in the transmissive regions may be in the reflective regions. No display may be performed in the reflective regions during the color display (when the transmissive regions emit light), that is, the reflective regions may be the non-light-emitting region during the color display. The first thin-film transistors may be configured at the non-light-emitting region during the color display, which may not occupy the space of the light-emitting region of the color sub-pixels, thereby improving the aperture ratio of the color display. Furthermore, in the present disclosure, the second common electrode corresponding to all of the transmissive regions and reflective regions may be configured on the array substrate, and the same voltage signals may be applied to the second common electrode and the first common electrode. In such way, the coupling capacitance between the second common electrode and the second pixel electrodes may ensure no abnormal display during the color display, and the coupling capacitance between the second common electrode and the first pixel electrodes may ensure no abnormal display during the black-and-white display, which may improve the switching effect between the color display and the black-and-white display as a whole. Moreover, in the present disclosure, the film layer of the second common electrode may be between the film layer having the first thin-film transistors and the film layer having the first pixel electrodes, which may ensure that the distance between the second common electrode and each of the first pixel electrode and the second pixel electrode respectively along the direction perpendicular to the array substrate may be small. In such way, the coupling capacitance formed by the second common electrode and the first pixel electrodes may be sufficiently large during the black-and-white display, which may effectively avoid the abnormal display during the black-and-white display; and the coupling capacitance formed by the second common electrode and the second pixel electrodes may also be sufficiently large during the color display, which may effectively avoid the abnormal display during the color display.

The details of the present disclosure have been described through the embodiments provided above. However, those skilled in the art should understand that the disclosed embodiments are exemplary only and are not intended to limit the scope of the present disclosure. Those skilled in the art should understand that the disclosed embodiments can be modified according to the scope and principles of the present disclosure. The scope of the present disclosure is defined by the appended claims and their equivalents.

What is claimed is:

1. A display panel, comprising:
　a display region, an array substrate, a color film substrate opposite to the array substrate, and a liquid crystal layer between the array substrate and the color film substrate, wherein:
　　the display region includes transmissive regions each including color sub-pixels, and reflective regions each including black-and-white sub-pixels;
　　a first common electrode is configured in the color film substrate corresponding to all of the transmissive regions and the reflective regions;
　　a plurality of first pixel electrodes is configured spaced apart from one another and in a portion of the array substrate corresponding to the transmissive regions, and the plurality of the first pixel electrodes correspond to the color sub-pixels;
　　a plurality of second pixel electrodes, a reflective layer and a plurality of first thin-film transistors are configured in a portion of the array substrate corresponding to the reflective regions, and the plurality of the second pixel electrodes correspond to the black-and-white sub-pixels;
　　the reflective layer is at a side of the plurality of the second pixel electrodes adjacent to the liquid crystal layer; the plurality of the thin-film transistors is at a side of the plurality of the second pixel electrodes away from the liquid crystal layer; and one first thin-film transistor is electrically connected to one first pixel electrode; and a second common electrode is configured in the array substrate corresponding to all of the transmissive regions and the reflective regions; along a direction perpendicular to the array substrate, the second common electrode is between a first thin-film transistor and a second pixel electrode; and the second common electrode and the first common electrode is configured to receive a same voltage signal.

2. The display panel according to claim 1, wherein:
the color sub-pixels are arranged along a first direction to form one or more color sub-pixel rows, and the black-and-white sub-pixels are arranged along the first direction to form one or more black-and-white sub-pixel rows; and one black-and-white sub-pixel row is between two adjacent color sub-pixel rows.

3. The display panel according to claim 2, wherein:
the black-and-white sub-pixel rows and the color sub-pixel rows are alternately arranged along a second direction, and the second direction intersects the first direction.

4. The display panel according to claim 2, wherein:
two color sub-pixel rows are between adjacent black-and-white sub-pixel rows along a second direction, and the second direction intersects the first direction.

5. The display panel according to claim 2, wherein:
along the first direction, a width of the color sub-pixel is d1 and a width of the black-and-white sub-pixel is d2, wherein d2≥n*d1, n is a positive integer, and n≥1.

6. The display panel according to claim 2, wherein:
along a second direction, a height of the color sub-pixel is h1 and a height of the black-and-white sub-pixel is h2, wherein h1>h2, and the second direction intersects the first direction.

7. The display panel according to claim 2, wherein:
for a same black-and-white pixel row, m second pixel electrodes of at least m black-and-white sub-pixels, sequentially adjacent to one another, are electrically connected to one another, wherein m is a positive integer and m≥1.

8. The display panel according to claim 2, wherein:
along a second direction, p second pixel electrodes of at least p black-and-white sub-pixels, sequentially adjacent to one another, are electrically connected to one another, wherein p is a positive integer and p≥1; and the second direction intersects the first direction.

9. The display panel according to claim 2, further including:
a non-display region surrounding the display region, wherein:
the non-display region includes a first drive chip and a second drive chip; the first drive chip is configured to provide data drive signals to the transmissive regions; and the second drive chip is configured to provide data drive signals to the reflective regions.

10. The display panel according to claim 9, wherein:
the array substrate includes a plurality of scan lines extending along the first direction and a plurality of first data signal lines and a plurality of second data signal lines extending along a second direction, wherein the first direction intersects the second direction; and
a gate of the first thin-film transistor is electrically connected to a scan line; a drain of the first thin-film transistor is electrically connected to the first pixel electrode; one end of a first data signal line is electrically connected to a source of the first thin-film transistor, and another end of the first data signal line is electrically connected to the first drive chip; one end of a second data signal line is electrically connected to the second pixel electrode, and another end of the second data signal line is electrically connected to the second drive chip.

11. The display panel according to claim 10, wherein:
the color sub-pixels are arranged along a second direction to form one or more color sub-pixel columns;
one color sub-pixel row is driven by two scan lines;
in a same color sub-pixel row, two adjacent color sub-pixels are electrically connected to a same first data signal line and connected to different scan lines; and
two adjacent color sub-pixel columns share one first data signal line along the first direction.

12. The display panel according to claim 11, wherein:
the second data signal line is between the two adjacent color sub-pixel columns.

13. The display panel according to claim 12, wherein:
one or more second data signal lines are configured between two adjacent first data signal lines.

14. The display panel according to claim 13, wherein:
the second data signal line and the first data signal line are configured in a same single layer.

15. The display panel according to claim 10, wherein:
the first data signal line and the second data signal line are configured in different layers; and
a projection of the second data signal line on the array substrate overlaps a projection of the first data signal line on the array substrate along the direction perpendicular to the array substrate; and an insulation layer is configured between the first data signal line and the second data signal line.

16. The display panel according to claim 9, wherein:
the first drive chip and the second drive chip are respectively in the non-display region on both sides of the display region along a second direction.

17. A display device, comprising:
a display panel, comprising:
a display region, an array substrate, a color film substrate opposite to the array substrate, and a liquid crystal layer between the array substrate and the color film substrate, wherein:
the display region includes transmissive regions each including color sub-pixels, and reflective regions each including black-and-white sub-pixels;
a first common electrode is configured in the color film substrate corresponding to all of the transmissive regions and the reflective regions;
a plurality of first pixel electrodes is configured spaced apart from one another and in a portion of the array substrate corresponding to the transmissive regions, and the plurality of the first pixel electrodes correspond to the color sub-pixels;
a plurality of second pixel electrodes, a reflective layer and a plurality of first thin-film transistors are configured in a portion of the array substrate corresponding to the reflective regions, and the plurality of the second pixel electrodes correspond to the black-and-white sub-pixels;
the reflective layer is at a side of the plurality of the second pixel electrodes adjacent to the liquid crystal layer; the plurality of the thin-film transistors is at a side of the plurality of the second pixel electrodes away from the liquid crystal layer; and one first thin-film transistor is electrically connected to one first pixel electrode; and a second common electrode is configured in the array substrate corresponding to all of the transmissive regions and the reflective regions; along a direction perpendicular to the array substrate, the second common electrode is between a first thin-film transistor and a second pixel electrode; and the second common electrode and the first common electrode is configured to receive a same voltage signal.

\* \* \* \* \*